United States Patent
Tabery et al.

(10) Patent No.: US 7,351,638 B1
(45) Date of Patent: Apr. 1, 2008

(54) SCANNING LASER THERMAL ANNEALING

(75) Inventors: Cyrus E. Tabery, Cupertino, CA (US);
Eric N. Paton, Morgan Hill, CA (US);
Bin Yu, Cupertino, CA (US); Qi Xiang,
San Jose, CA (US); Robert B. Ogle,
San Jose, CA (US)

(73) Assignee: Advanced Micro Devices, Inc.,
Sunnyvale, CA (US)

( * ) Notice: Subject to any disclaimer, the term of this patent is extended or adjusted under 35 U.S.C. 154(b) by 1172 days.

(21) Appl. No.: 10/021,782

(22) Filed: Dec. 18, 2001

(51) Int. Cl.
*H01L 21/336* (2006.01)

(52) U.S. Cl. ............... 438/308; 438/795; 257/21.328

(58) Field of Classification Search ............ 438/1–800, 438/914; 257/1–930, E21.328; 738/308
See application file for complete search history.

(56) References Cited

U.S. PATENT DOCUMENTS 6,242,292 B1 * 6/2001 Yamazaki et al. .......... 438/166
6,248,606 B1 * 6/2001 Ino et al. .................... 438/30
6,303,446 B1 * 10/2001 Weiner et al. .............. 438/299

* cited by examiner

*Primary Examiner*—Michael Lebentritt
*Assistant Examiner*—Stanetta Isaac
(74) *Attorney, Agent, or Firm*—McDermott Will & Emery LLP

(57) ABSTRACT

A method of manufacturing a semiconductor device includes forming a gate electrode over a substrate, implanting dopants into the substrate and activating the dopants using laser thermal annealing. During annealing, the laser and substrate are moved relative to one another, and the movement of the laser and the substrate relative to one another does not pause between and during activating one portion of the source/drain regions and activating another portion of the source/drain regions. Each pulse from the laser can respectively irradiate different portions of the source/drain regions, and a spot area of the laser is less than 50 millimeter$^2$.

7 Claims, 5 Drawing Sheets

SCANNING LASER THERMAL ANNEALING

FIELD OF THE INVENTION

The present invention relates to the manufacturing of semiconductor devices, and more particularly, to laser thermal anneal processes having improved efficiency.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the distance between the source region and the drain region of the MOSFET (i.e., the physical channel length) decreases, in the effort to increase circuit speed and complexity, the junction depth of source/drain regions must also be reduced to prevent unwanted source/drain-to-substrate junction capacitance. However, obtaining these smaller junction depths tests the capabilities of current processing techniques, such as ion implantation with activation annealing using rapid thermal annealing. Rapid thermal annealing typically involves heating the silicon wafer, after implanting, under high-intensity heat lamps. Implanting or doping amorphitizes the silicon substrate, and the activation annealing is used to recrystallize the amorphitized silicon region.

As a result of the limitations of rapid thermal annealing, laser thermal annealing is being implemented, particularly for ultra-shallow junction depths. Laser thermal annealing may be performed after ion implantation of a dopant and involves heating the doped area with a laser. The laser radiation rapidly heats the exposed silicon such that the silicon begins to melt. The diffusivity of dopants into molten silicon is about eight orders of magnitude higher than in solid silicon. Thus, the dopants distribute almost uniformly in the molten silicon and the diffusion stops almost exactly at the liquid/solid interface. The heating of the silicon is followed by a rapid quench to solidify the silicon, and this process allows for non-equilibrium dopant activation in which the concentration of dopants within the silicon is above the solid solubility limit of silicon. Advantageously, this process allows for ultra-shallow source/drain regions that have an electrical resistance about one-tenth the resistance obtainable by conventional rapid thermal annealing.

One problem associated with laser thermal annealing is that the fluence provided by a laser, such as an excimer laser, can vary from pulse to pulse by as much as ±5%. The minimum fluence needed to properly activate the source/drain regions is used to determine the setting of the laser. However, as the variance from pulse to pulse increases, the laser must be set to deliver a higher average fluence to ensure that the minimum fluence needed to activate the source/drain regions is provided. Because a higher average fluence is provided, excess fluence can also be delivered to the substrate, which causes problems, such as overmelting of the source/drain regions.

Another problem associated with current methods of laser thermal annealing is that current systems employ laser spot dimensions on the order of 20 millimeters×20 millimeters. The large dimension of the laser spot serves to decrease the number of pulses the laser must fire to cover the surface area of the wafer. However, a problem with a large spot size is that the fluence density across the spot can vary significantly, and this variation in fluence density cause problems of insufficient exposure in some instances and over-exposure in other instances. Still another problem associated with employing a large laser spot is that the laser must be turned off as the laser moves from one position to the next. As such, the laser is not being efficiently utilized. Accordingly, a need exists for an improved laser anneal process that reduces variance of fluence being provided to the substrate and increases the efficiency of the laser annealing process.

SUMMARY OF THE INVENTION

This and other needs are met by embodiments of the present invention which provide a method of manufacturing a semiconductor device that reduces the total amount of fluence required to activate the source/drain regions of the semiconductor device and increases the efficiency of the laser annealing process. The method includes forming a gate electrode over a substrate; introducing ions into the substrate to form source/drain regions proximate the gate electrode; and laser thermal annealing to activate the source/drain regions. During annealing, the laser and substrate are moved relative to one another, and the movement of the laser and the substrate relative to one another does not pause between and during the step of activating one portion of the source/drain regions and the step of activating another portion of the source/drain regions.

By continually moving the substrate and the laser relative to one another, the pulsing of the laser is not interrupted. As such, a greater utilization of the laser can be obtained, which allows for an increased throughput of wafers through the laser thermal annealing process.

In another aspect of the present invention, the source/drain regions are exposed to multiple pulses. By using multiple pulses, the variations in fluence provided by each pulse is averaged out, and the total average fluence to the surface can be reduced. By reducing the total fluence and the amount of variance of fluence provided by each pulse, the incidence of over-melting can be reduced. In still another aspect of the present invention, a smaller laser spot size is used. By using a smaller spot size, the variance of fluence density within the spot can also be reduced.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention reduces, at least in part, the variance in fluence provided to the surface of a semiconductor substrate during laser thermal annealing and increases the efficiency of the laser thermal process. This is achieved, in part, by constantly moving the surface and the laser relative to one another during the laser thermal annealing process. In so doing, the laser can continue to fire pulses, which increases efficiency of the laser. Also, multiple pulses can strike a particular area, which decreases the total variance of fluence this particular area receives. Furthermore, by using a smaller laser spot size, the fluence density within the spot is less distorted, and a smaller spot is more conducive to continuous movement of the laser and surface relative to one another.

An embodiment of the present invention is illustrated in FIGS. 1A-1F. A substrate is provided and can be formed from any material suitable for integrated circuit manufacture. However, in one aspect, the substrate is formed from single-crystal silicon, with a <100> crystallographic orientation and which has been slightly doped with n-type or p-type impurities. Separate MOS devices are separated on the silicon substrate using isolation structures, such as a field oxide or a shallow isolation trench (not shown).

A shallow isolation trench, for example, can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 1A:
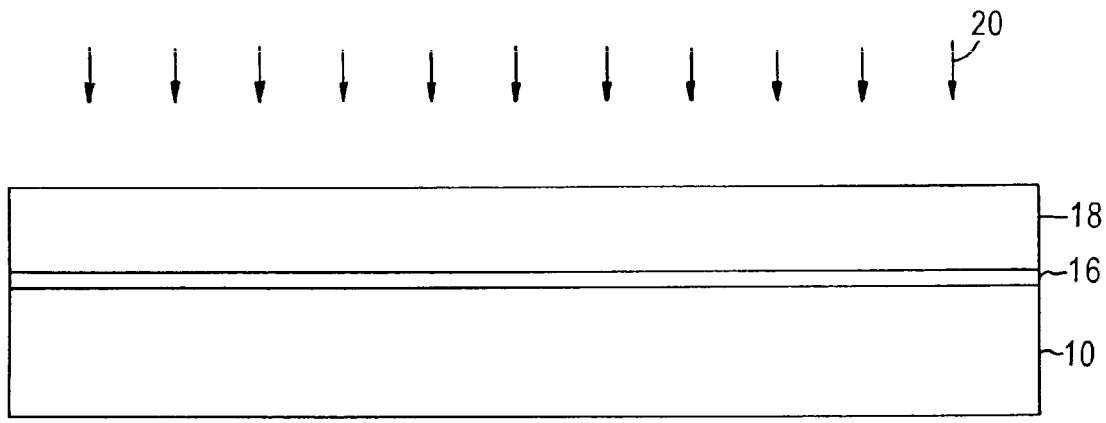
FIGS. 1A-1F schematically illustrate sequential phases of a MOS fabrication method using a laser thermal annealing process according to an embodiment of the present invention.

In FIG. 1A, a gate dielectric 16 is formed on the top surface of the substrate 10, and the gate dielectric 16 is not limited as to a particular material. However, in one aspect of the invention, the gate dielectric 16 is formed from silicon dioxide, for example, using thermal oxidation at temperatures from about 700 to 1000° C. in an oxygen-steam ambient. Although not limited in this manner, the gate dielectric 16 can have a thickness from about 30 to 200 angstroms. After deposition of the gate dielectric 16, a gate electrode is formed over the gate dielectric 16.

Although the gate electrode is not limited as to a particular material, in a current aspect of the invention, the formation of a gate electrode involves depositing a blanket layer of undoped polysilicon 18, for example by low pressure chemical vapor deposition (LPCVD) at temperatures from about 600 to 800° C., on the top surface of gate dielectric 16. Although not limited in this manner, the polysilicon layer 18 can have a thickness from about 500 to 5000 angstroms. The polysilicon layer 18 can then be implanted with nitrogen ions, as depicted by arrows 20, which can be used, for example, to retard the diffusion of boron atoms. The implantation of the nitrogen ions can be at a dosage from about $5 \times 10^{14}$ to $5 \times 10^{15}$ dopants/cm$^2$ and at an energy level from about 20 to 200 keV.

Figure 1B:
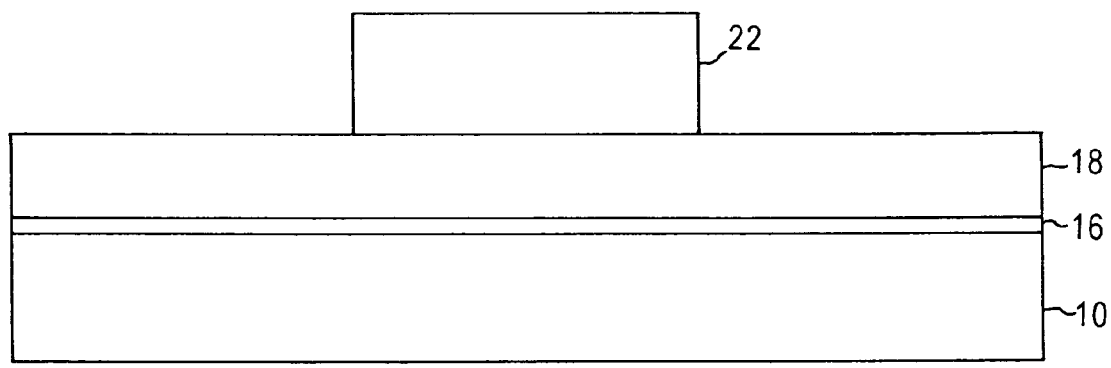

In FIG. 1B, the layers over the gate dielectric 16 are etched to form the gate electrode. The etching of the gate typically involves forming a photoresist 22 on the polysilicon layer 18, and the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which will thereby define the gate electrode.

Figure 1C:
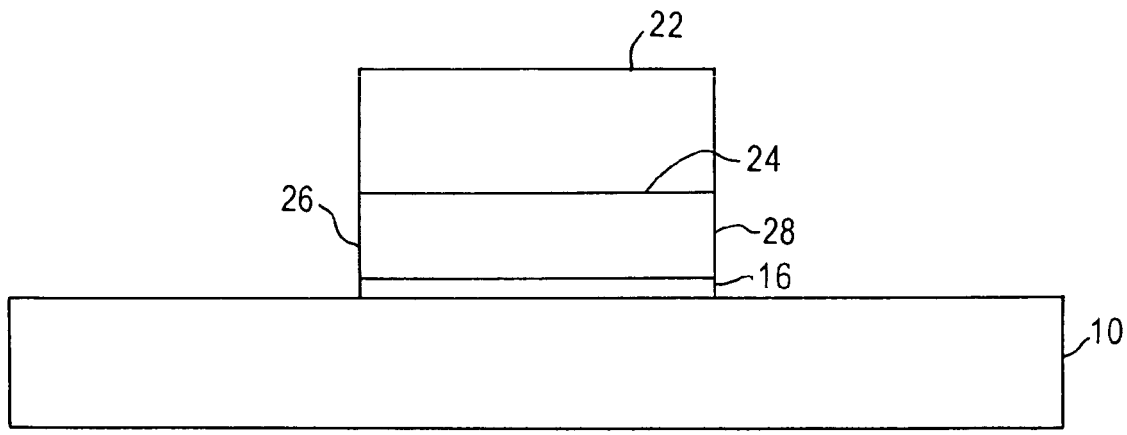

In FIG. 1C, an etch, typically anisotropic, is applied to remove the exposed portions of the polysilicon layer 18 and the underlying portions of the gate dielectric 16. After etching, the remaining portion of the polysilicon layer 18 provides a gate electrode 24 having opposing vertical sidewalls 26, 28. Although not limited in this manner, the width of the gate electrode 24 between the sidewalls 26, 28 can be from about 500 to 2500 angstroms.

Figure 1D:
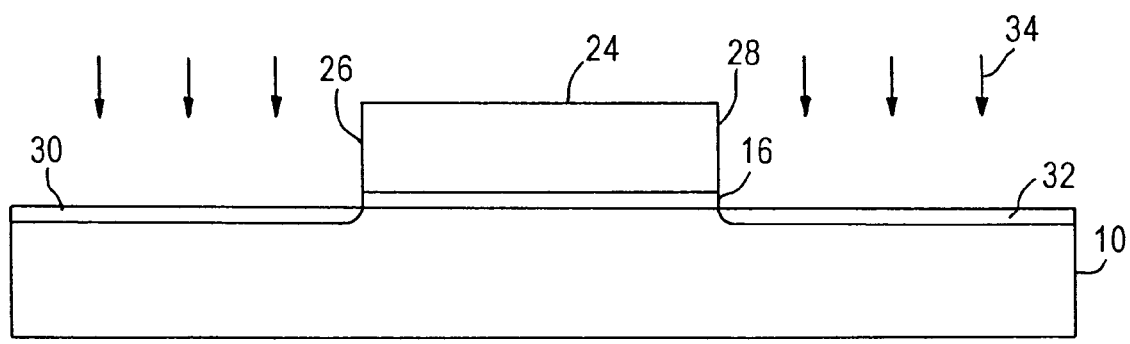

In FIG. 1D, the photoresist 22 is stripped, and lightly doped (LDD) source/drain extensions 30, 32 are formed by an ion implantation, as represented by arrows 34. The ion implantation may be an n-type dopant, such as arsenic or phosphorus, if an NMOSFET is desired, or a p-type dopant, such as boron, if a PMOSFET is desired. Illustrative examples of implant energies and dosages for doping respectively range from about 2 to 20 keV and from about $5 \times 10^{14}$ to $3 \times 10^{15}$ dopants/cm$^2$. The source/drain extensions 30, 32 are formed within the substrate 10 immediately adjacent to the sidewalls 26, 28 and are self-aligned with the gate electrode 24. After implantation, annealing is conducted to activate the source/drain extensions 30, 32 and to recrystallize the extensions. Alternatively, the annealing can occur after formation of the source/drain regions. The annealing of the source/drain extensions 30, 32 is not limited as to a particular method. For example, rapid thermal anneal or laser thermal annealing can be used. Typically, the source/drain extensions 30, 32 extend down from the surface of the silicon substrate 10 to a depth of about 50 angstroms to 300 angstroms.

Figure 1E:
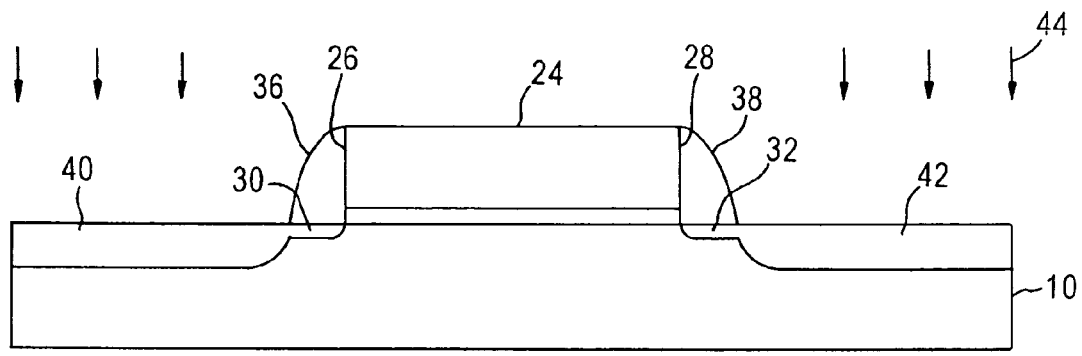

In FIG. 1E, sidewall spacers 36, 38 are formed following the implantation of the source/drain extensions 30, 32. Formation of the sidewall spacers 36, 38 typically involves blanket depositing a spacer material over the substrate 10. The spacer material can be silicon nitride or some other material, such as plasma-enhanced oxide (PEOX) or tetraethoxysilane (TEOS) oxide. The blanket deposition is followed by an anisotropic etch, which removes the spacer material except for the sidewall spacers 36, 38 immediately adjacent to the sidewalls 26, 28 of the gate electrode 24 and over the substrate 10.

After formation of the sidewall spacers 36, 38, heavily doped (HDD) or moderately doped (MDD) source/drain regions 40, 42 are formed by a second ion implantation, as represented by arrows 44. The source/drain regions 40, 42 are formed within the substrate 10 and extend past the source/drain extensions 30, 32 immediately adjacent to the sidewall spacers 36, 38. The sidewall spacers 36, 38 act as masks, which protect portions of the source/drain extensions 30, 32 from being heavily doped. Illustrative examples of implant energies and dosages for doping respectively range from about 0.5 keV to 60 keV and from about $1 \times 10^{14}$ to $5 \times 10^{15}$ dopants/cm$^2$.

In one aspect of the invention, the source/drain regions 40, 42 can also be amorphized, and an example method of amorphizing the substrate 10 involves doping the substrate with an inert atom, such as Si, Ge, or a noble ion. Illustrative examples of implant energies and dosages for doping respectively range from about 30 keV to 130 keV and from about $5 \times 10^{13}$ to $5 \times 10^{14}$ dopants/cm$^2$. The implanting of the source/drain regions 40, 42 with an inert atoms amorphizes the silicon, which must then be recrystallized to activate the source/drain regions 40, 42.

Figure 1F:
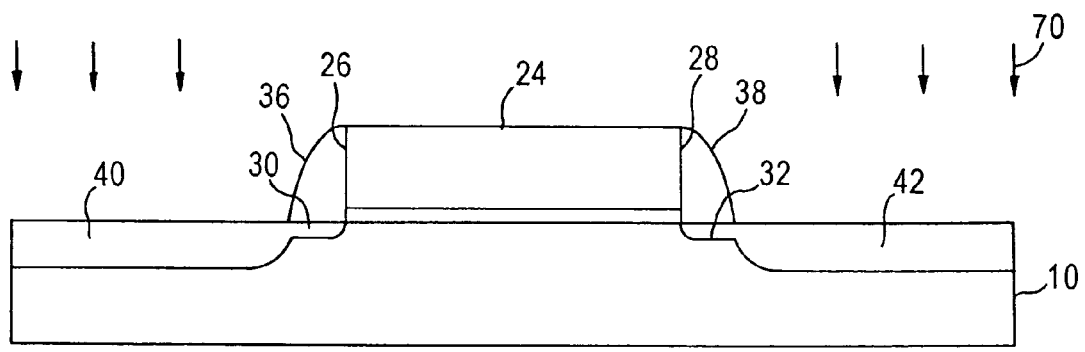

In FIG. 1F, after implantation of the source/drain regions 40, 42, the source/drain regions 40, 42 are activated using a laser thermal annealing process. The energy from the laser, represented by arrows 70, is applied to liquefy the substrate 10 to the desired depth of source/drain regions 40, 42. An example of a laser capable of providing this energy is a spatially homogenized 308 nm XeCl pulsed laser, although the invention is not limited in this manner, and the energy and power of the laser can vary in accordance with different applications. Typically, the source/drain regions 40, 42 extend down from the surface of the silicon substrate 10 to a depth of about 400 angstroms to about 1000 angstroms.

The energy fluence of the laser at the surface determines the melt duration that occurs at the surface, and melt duration is related to maximum melt depth. The relationship between melt duration and maximum melt depth depends on the temporal profile of the laser beam. Precise control of junction or melt depth is possible due to the capability of measuring the full width height maximum (FWHM) of the laser and the surface melt duration during the process. Relatively large changes in the energy fluence are required to create small changes in the maximum melt depth. For example, a fluence range of approximately 100 mJ/cm$^2$ to 750 J/cm$^2$ results in junction depths ranging from 200 angstroms to 1500 angstroms from a 308 nm excimer laser at a 9 Hz repetition rate.

The fluence range for laser irradiation can extend from about 50 mJ/cm$^2$ to about 1.3 J/cm$^2$. However, the fluence of the laser can be advantageously controlled to melt only to a depth that the silicon has been amorphized because amorphous silicon absorbs energy at a higher rate than crystalline silicon. For example, a fluence of about 400 mJ/cm$^2$ can be used to melt amorphous silicon and not melt crystalline silicon.

Figure 2A:
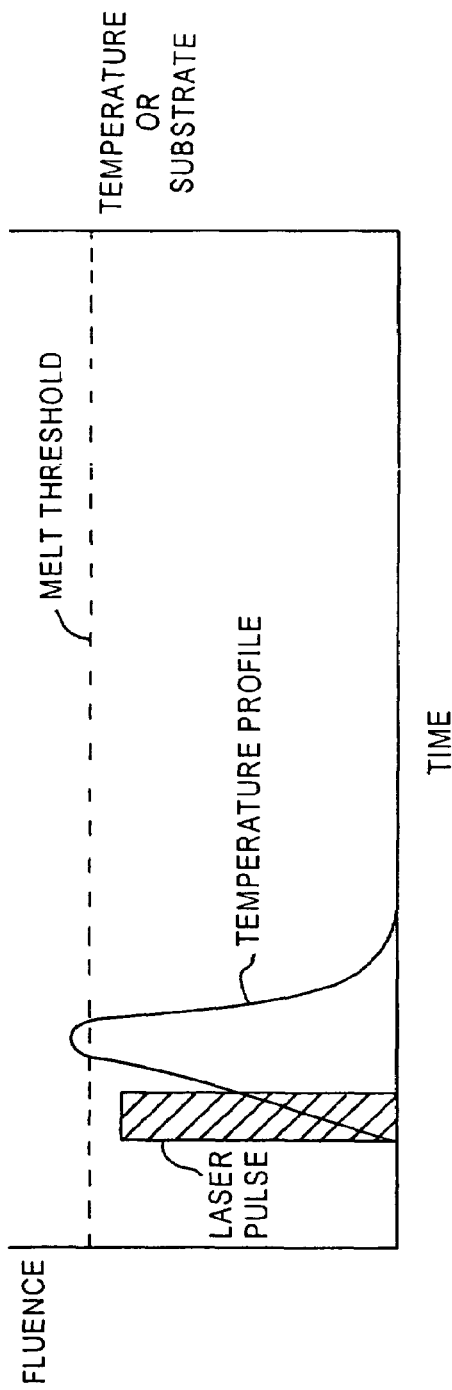
FIG. 2A is a chart illustrating a fluence and temperature profile over time using a method of laser thermal annealing according to the prior art.

In previous laser thermal annealing applications, as illustrated in FIG. 2A, a portion of the surface of the substrate is exposed to a single pulse of a laser, and the laser is then moved to irradiate a separate portion of the surface. As shown in the chart, a single laser pulse provides the total annealing dosage to activate the source/drain regions. This dosage is typically a sufficient fluence for the irradiated portion of the surface to reach a temperature that provides for melting of the irradiated portion. The sequence of irradiating a particular portion of the surface, moving to a new portion, and irradiating the new portion is continued until the complete surface of the surface is exposed.

Figure 2B:
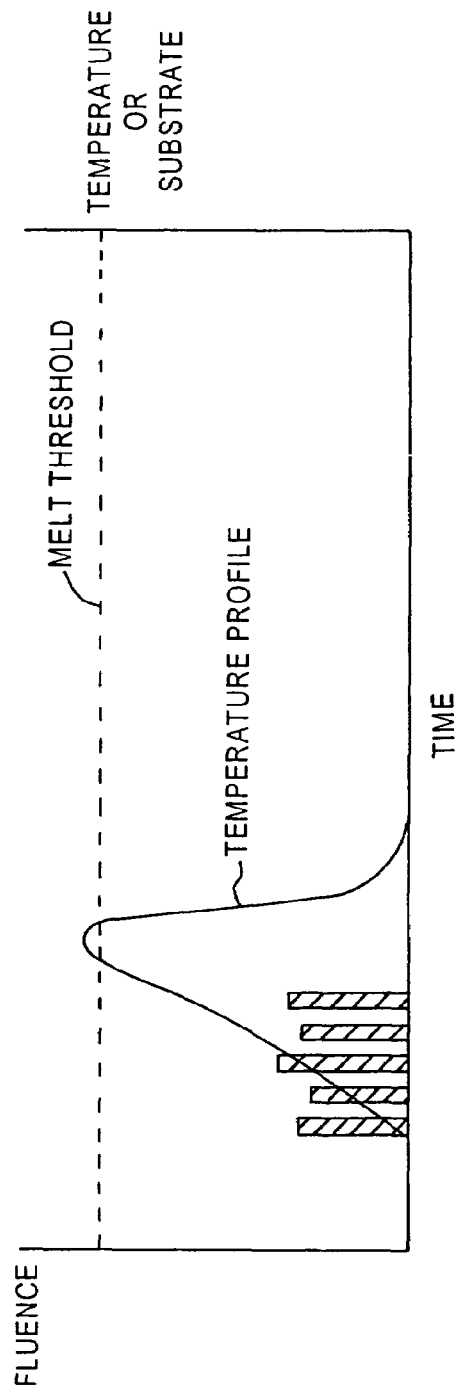
FIG. 2B is a chart illustrating an exemplary fluence and temperature profile over time using a method of laser thermal annealing according to an aspect of the present invention.

In one aspect of the present invention, as illustrated in FIG. 2B, a discrete portion of the surface is exposed to several pulses of a laser. The total fluence provided to the surface is obtained by calculating the minimum fluence necessary to reach a temperature that provides for melting and using the known variance of the laser to determine a mean fluence that ensures that the minimum fluence for melting will always be provided.

An advantage of exposing a discrete portion of the surface to several pulses is that variations in fluence between each pulse can be averaged out. Thus, the total fluence absorbed by the surface will have less variation than if a single pulse is used. By reducing the variance of total fluence provided to the surface, a reduced fluence can be used to ensure a minimum fluence needed for activation of the source/drain regions. Therefore, a reduced total fluence can be used and still ensure melting. Also, by using a reduced total fluence, the incidence of over-melting can also be reduced.

In another aspect of the present invention, a smaller spot or slit for the laser can be provided. The slot or slit of a laser is the surface area that is irradiated by a laser during a single pulse. When a smaller spot is used, such as about 2 millimeters×2 millimeters or about 2 millimeters×20 millimeters, the fluence density across the spot is less distorted than with a larger spot, such as 20 millimeters×20 millimeters. Because the fluence density is less distorted using a smaller spot, the variation of total fluence provided to the surface is also reduced, thereby resulting in the benefits discussed above. Although not limited in this manner, the spot area of the laser is less than 50 millimeters$^2$ in certain aspects.

Figure 3:
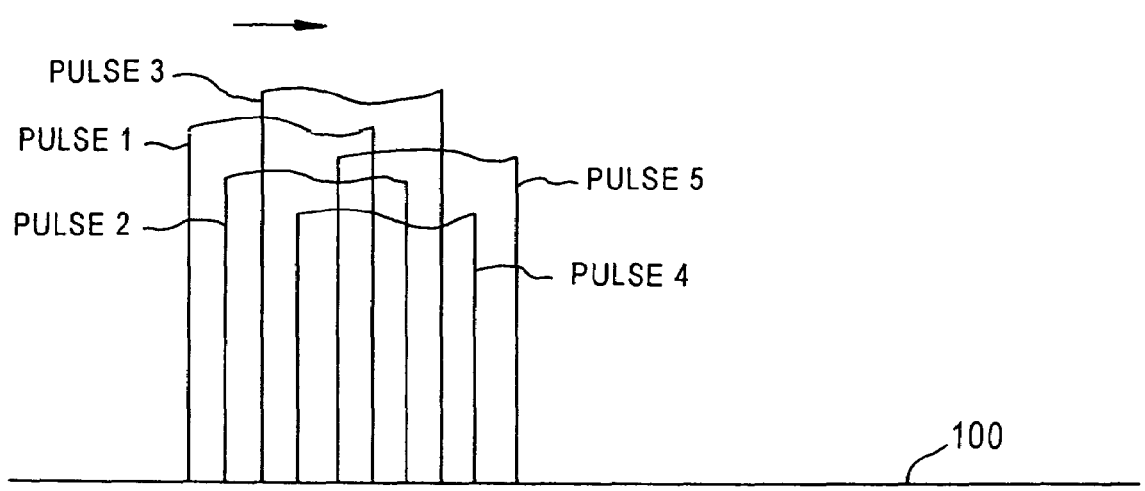
FIG. 3 illustrates a scanning laser thermal annealing process with a surface and laser in constant notion relative to one another according to an aspect of the present invention.

In still another aspect of the invention, as illustrated in FIG. 3, when the surface 100 is being irradiated with multiple pulses from the laser, the surface and the laser can be in constant motion relative to one another as illustrated by the arrow. Equipment capable of providing relative movement between a surface 100 being irradiated and the radiation source are known to those in the semiconductor fabrication field, lithography scanning systems for example, and the invention is not limited as to a particular type of equipment so capable. The relative velocity of the surface 100 and the laser is a function of factors that include laser power, pulse frequency, spot area dimensions, and the total fluence to activate the source/drain regions.

When a smaller spot size is used, the velocity of the surface 100 relative to the laser can be controlled such that the laser is continually pulsed as the surface 100 moves relative to the laser. In so doing, the laser is not required to stop lasing before moving from one portion to the next. By not stopping the laser from pulsing, a greater utilization of the laser can be obtained, thereby advantageously increasing throughput of wafers through the laser thermal annealing process. The velocity of the surface 100 relative to the laser can also be controlled such that a discrete portion of the surface is exposed to a single pulse or multiple pulses. As previously stated, by using multiple pulses, the variation of total fluence provided to the surface 100 is reduced.

After the silicon in the source/drain regions has been melted, which takes approximately 30-100 nanoseconds, the silicon will cool rapidly, within about one microsecond, and the silicon will reform epitaxially. In so doing, the source/drain regions are activated.

The use of a smaller laser spot size and constant movement of the surface and laser relative to one another can reduce the variance in fluence provided to the surface of a semiconductor substrate during laser thermal annealing, and the decrease in variance allows for a decrease in the average amount of fluence provided to the surface. Also, the efficiency of the laser thermal process can be increased because of increased utilization of the laser.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:
   forming a gate electrode over a substrate;
   introducing ions into the substrate to form source/drain regions in the substrate proximate to the gate electrode;
   activating a portion of the source/drain regions by laser thermal annealing using a laser;
   moving the laser and the substrate relative to one another; and
   activating another portion of the source/drain regions by laser thermal annealing using the laser, wherein
   each pulse from the laser respectively irradiates non-identical portions of the source/drain regions, and
   a spot area of the laser on the substrate is less than 50 millimeters$^2$.

2. A method of manufacturing a semiconductor device, comprising the steps of:
   forming a gate electrode over a substrate;
   introducing ions into the substrate to form source/drain regions in the substrate proximate to the gate electrode;
   activating a portion of the source/drain regions by laser thermal annealing using a laser;
   moving the laser and the substrate relative to one another; and
   activating another portion of the source/drain regions by laser thermal annealing using the laser,
   wherein a spot area of the laser on the substrate is less than 50 millimeters$^2$.

3. The invention according to claim 2, wherein each portion of the source/drain regions receives no more than one single pulse of energy from the laser.

4. The invention according to claim 2, wherein each portion of the source/drain regions receives more than one single pulse of energy from the laser.

5. The invention according to claim 4, wherein each pulse from the laser respectively irradiates non-identical portions of the source/drain regions.

6. The invention according to claim 2, wherein the laser and the substrate move relative to one another at a constant velocity.

7. A method of manufacturing a semiconductor device, comprising the steps of:
   forming a gate electrode over a substrate;
   introducing ions into the substrate to form source/drain regions in the substrate proximate to the gate electrode;
   activating a portion of the source/drain regions by laser thermal annealing using a pulse of laser energy from a laser;
   moving the laser and the substrate relative to one another; and
   activating another portion of the source/drain regions by laser thermal annealing using another pulse of laser energy from the laser, wherein
   the laser and the substrate move relative to one another after each pulse of laser energy and each portion of the source/drain regions receives more than one single pulse of energy from the laser, and
   a spot area of the laser on the substrate is less than 50 millimeters$^2$.

* * * * *